US010741427B2

(12) United States Patent
Wang et al.

(10) Patent No.: US 10,741,427 B2
(45) Date of Patent: Aug. 11, 2020

(54) COATING APPARATUS FOR REDUCING WASTE OF COATING LIQUID, METHOD FOR RECYCLING COATING LIQUID BY UTILIZATION OF THE SAME, AND METHOD FOR CLEANING THE SAME

(71) Applicants: BOE TECHNOLOGY GROUP CO., LTD., Beijing (CN); BEIJING BOE DISPLAY TECHNOLOGY CO., LTD., Beijing (CN)

(72) Inventors: Jianfeng Wang, Beijing (CN); Kaimin Wu, Beijing (CN); Chongxi Wei, Beijing (CN); Peng Chen, Beijing (CN); Lei Zhu, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 195 days.

(21) Appl. No.: 15/720,862

(22) Filed: Sep. 29, 2017

(65) Prior Publication Data
US 2018/0141077 A1    May 24, 2018

(30) Foreign Application Priority Data
Nov. 22, 2016    (CN) .......................... 2016 1 1028101

(51) Int. Cl.
*B05C 11/10*    (2006.01)
*H01L 21/67*    (2006.01)
(Continued)

(52) U.S. Cl.
CPC ........ *H01L 21/6715* (2013.01); *B05B 1/3093* (2013.01); *B05B 15/58* (2018.02);
(Continued)

(58) Field of Classification Search
CPC ............ G03F 7/3092; H01L 21/67017; H01L 21/6715; B41J 2/18; B41J 2/19;
(Continued)

(56) References Cited

U.S. PATENT DOCUMENTS 3,939,855 A * 2/1976 Wiggins .................... B05B 5/16
137/15.04
5,102,046 A * 4/1992 Diana ..................... B05B 12/14
239/112
(Continued)

FOREIGN PATENT DOCUMENTS

CN    101013266 A    8/2007
CN    10045228 B    6/2011
(Continued)

OTHER PUBLICATIONS

The First Chinese Office Action dated May 21, 2018, Appln. No. 201611028101.5.
(Continued)

*Primary Examiner* — Karl Kurple

(57) ABSTRACT

A coating apparatus, a method of recycling a coating liquid by utilization of the same and a method for cleaning the same are provided. The coating apparatus includes a supply device, a coater device and a recycling device. The supply device includes a liquid inlet, a liquid outlet and a coating liquid supply unit connected with the liquid inlet. The coater device includes a coating liquid nozzle including a receiving opening connected with the liquid outlet of the supply device, a coating opening and an exhaust opening. The recycling device includes a recycled liquid outlet and at least one recycling inlet including a supply process recycling inlet which is connected with the exhaust opening of the coating liquid nozzle, and the recycled liquid outlet is connected with the liquid inlet of the supply device.

11 Claims, 4 Drawing Sheets

(51) Int. Cl.
  *B05B 15/55* (2018.01)
  *G03F 7/16* (2006.01)
  *B05B 15/58* (2018.01)
  *B41J 2/18* (2006.01)
  *B05B 1/30* (2006.01)

(52) U.S. Cl.
  CPC ...... *B05C 11/1039* (2013.01); *B05C 11/1047* (2013.01); *B41J 2/18* (2013.01); *G03F 7/16* (2013.01)

(58) Field of Classification Search
  CPC ... B05B 1/3093; B05B 15/58; B05C 11/1039; B05C 11/1047
  See application file for complete search history.

(56) References Cited

U.S. PATENT DOCUMENTS

| | | | | |
|---|---|---|---|---|
| 6,371,667 | B1* | 4/2002 | Kitano | G03D 5/00 396/611 |
| 6,880,724 | B1* | 4/2005 | Liu | G03F 7/162 222/1 |
| 7,591,902 | B2* | 9/2009 | Rangarajan | B05B 15/50 118/326 |
| 7,846,984 | B2* | 12/2010 | Doi | B29B 17/0005 106/31.17 |
| 8,926,077 | B2* | 1/2015 | LaCaze | B41J 2/175 347/89 |
| 9,086,190 | B2* | 7/2015 | Furusho | H01L 21/67017 |
| 9,844,948 | B2* | 12/2017 | Ando | B41J 2/18 |
| 2002/0085076 | A1* | 7/2002 | Romano, Jr. | B41J 2/18 347/89 |
| 2007/0261636 | A1* | 11/2007 | Rangarajan | B05B 15/50 118/326 |
| 2008/0087615 | A1* | 4/2008 | Taniguchi | G03F 7/162 210/805 |
| 2008/0230492 | A1* | 9/2008 | Kao | G03F 7/162 210/791 |
| 2013/0260569 | A1* | 10/2013 | Ganster | H01L 21/67017 438/745 |
| 2015/0028055 | A1* | 1/2015 | Hayama | B05C 5/025 222/55 |
| 2015/0048035 | A1* | 2/2015 | Liao | B01D 35/02 210/767 |
| 2015/0331322 | A1* | 11/2015 | Carcasi | B05B 7/26 222/1 |
| 2016/0062372 | A1 | 3/2016 | Hayashi et al. | |
| 2018/0065065 | A1* | 3/2018 | Sasa | F04B 53/20 |
| 2018/0104960 | A1 | 4/2018 | Zhao | |
| 2018/0170066 | A1* | 6/2018 | Ohtsu | B41J 2/19 |

FOREIGN PATENT DOCUMENTS

| | | |
|---|---|---|
| CN | 102233312 A | 11/2011 |
| CN | 102688828 A | 9/2012 |
| CN | 203091218 U | 7/2013 |
| CN | 103769351 A | 5/2014 |
| CN | 103977989 A | 8/2014 |
| CN | 104289379 A | 1/2015 |
| CN | 105229777 A | 1/2016 |
| CN | 106004044 A | 10/2016 |
| KR | 1020080019165 A | 3/2008 |

OTHER PUBLICATIONS

The Third Chinese Action dated Nov. 16, 2018: Appln. No. 201611028101.5.

* cited by examiner

COATING APPARATUS FOR REDUCING WASTE OF COATING LIQUID, METHOD FOR RECYCLING COATING LIQUID BY UTILIZATION OF THE SAME, AND METHOD FOR CLEANING THE SAME

CROSS REFERENCE TO RELATED APPLICATION

This application claims the benefit of Chinese Patent Application No. 201611028101.5, filed on Nov. 22, 2016, which is hereby entirely incorporated by reference as a part of the present application.

TECHNICAL FIELD

Embodiments of the present disclosure relate to a coating apparatus, a method for recycling coating liquid by utilization of the coating apparatus, and a method for cleaning the coating apparatus.

BACKGROUND

In the manufacturing process of a display panel, it is a common film preparation method to form films (for instance, a photoresist layer, a gate insulating layer, a passivation layer and a planarization layer) in the display panel by coating via a coating apparatus.

Taking the adoption of a slit type coating apparatus (slot die coating apparatus) as an example, the basic use process of the coating apparatus includes: cleaning the coating apparatus; afterwards, providing a coating liquid to a coating liquid nozzle of the coating apparatus; and then, preparing a film by utilization of the coating liquid nozzle of the coating apparatus. In the process of preparing the film, the coating liquid nozzle of the coating apparatus moves along a surface of a substrate to be coated from one side of the substrate to the other opposite side of the substrate at a predetermined speed, and meanwhile, a coating opening of the coating liquid nozzle discharges a film material at a predetermined speed; and along with the movement of the coating liquid nozzle, the film material is coated to the surface of the substrate to form a corresponding film.

SUMMARY

Embodiments of the present disclosure provide a coating apparatus, a method of recycling a coating liquid by utilization of the coating apparatus and a method for cleaning the coating apparatus.

At least one embodiment of the present disclosure provides a coating apparatus, and the coating apparatus includes a supply device, a coater device and a recycling device. The supply device includes a liquid inlet, a liquid outlet and a coating liquid supply unit, the coating liquid supply unit is connected with the liquid inlet. The coater device includes a coating liquid nozzle, the coating liquid nozzle includes a receiving opening, a coating opening and an exhaust opening, and the receiving opening of the coating liquid nozzle is configured to be connected with the liquid outlet of the supply device. The recycling device includes a recycled liquid outlet and at least one recycling inlet, the at least one recycling inlet includes a supply process recycling inlet which is connected with the exhaust opening of the coating liquid nozzle, and the recycled liquid outlet is configured to be connected with the liquid inlet of the supply device.

At least one embodiment of the present disclosure provides a method for recycling a coating liquid by utilization of the above coating apparatus, and the method includes: adopting the recycling device to recycle the coating liquid from the exhaust opening of the coating liquid nozzle; and providing the coating liquid recycled by the recycling device to the supply device.

At least one embodiment of the present disclosure provides a method for cleaning the above coating apparatus, and the method includes: adopting the recycling device to recycle a coating liquid from at least one of the supply device or the coater device; and introducing a liquid cleaning agent into the at least one of the supply device or the coater device.

At least one embodiment of the present disclosure provides a coating apparatus and the coating apparatus includes a supply device, a coater device and a recycling device. The supply device includes a coating liquid supply unit, a filter and a supply pump which are sequentially connected, a liquid inlet and a liquid outlet, the coating liquid supply unit is connected with the liquid inlet; the supply pump is connected with the liquid outlet; the filter includes an inlet, a first outlet and a second outlet; the inlet is connected with the coating liquid supply unit; and the first outlet is connected with the supply pump. The coater device includes a coating liquid nozzle, the coating liquid nozzle includes a receiving opening and a coating opening, and the receiving opening of the coating liquid nozzle is connected with the liquid outlet of the supply device. The recycling device includes a supply process recycling inlet and a recycled liquid outlet, the supply process recycling inlet is connected with the second outlet of the filter, and the recycled liquid outlet is connected with the liquid inlet of the supply device.

At least one embodiment of the present disclosure provides a coating apparatus, and the coating apparatus includes: a supply device, configured for supplying a coating liquid and includes a liquid outlet; a coater device including a coating liquid nozzle which includes a receiving opening, a coating opening and an exhaust opening, with the receiving opening of the coating liquid nozzle configured to be connected with the liquid outlet of the supply device; and a recycling device includes a recycled liquid outlet, at least one recycling inlet and a recycling container, with the at least one recycling inlet including a supply process recycling inlet which is connected with the exhaust opening of the coating liquid nozzle, and the recycling container between the supply process recycling inlet and the recycled liquid outlet.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

Figure 1:
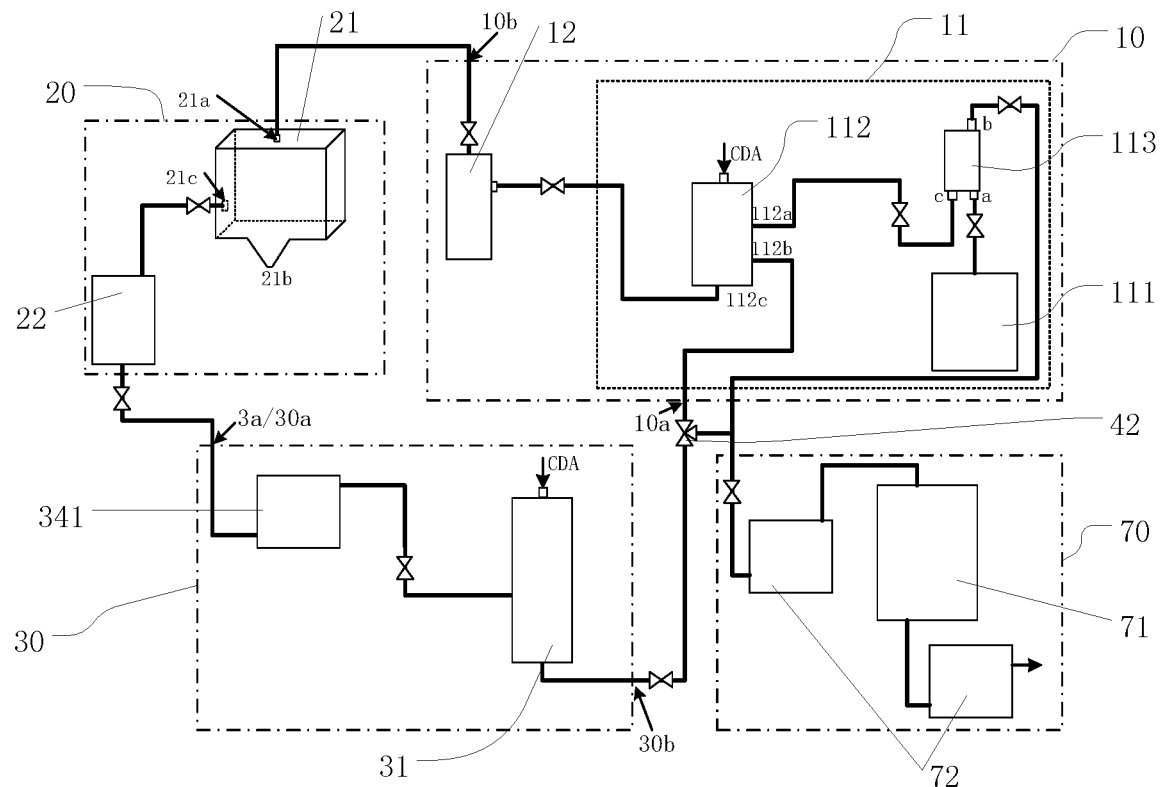
FIG. 1 is a first schematic structural view of a coating apparatus provided by an embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and in a situation where the position of the object which is described is changed, the relative position relationship may be changed accordingly.

The inventors of the application has noted that: in order to ensure the coating quality, in the process of providing a coating liquid (for instance, a photoresist or an other thin-film material) to a coating liquid nozzle of the coating apparatus, the coating liquid entering the coating liquid nozzle needs to be subjected to a bubble removal treatment (namely a treatment for removing bubbles); however, in the bubble removal process, a large amount of coating liquid flows out along with the discharge of gas bubbles at an exhaust opening of the coating liquid nozzle, and this results in the waste of the coating liquid.

Embodiments of the present disclosure provide a coating apparatus, a method for recycling a coating liquid by utilization of the coating apparatus, and a method for cleaning the coating apparatus. The coating apparatus recycles the coating liquid and provides the coating liquid recycled to a coating liquid supply device again for a subsequent coating operation, so that the waste of the coating liquid can be reduced.

The embodiments of the present disclosure may be applied in any substrate which needs to be coated with a film such as a display substrate (for instance, an array substrate or a color filter substrate).

Detailed description will be given below to the embodiments of the present disclosure with reference to the accompanying drawings. The following embodiments are only illustrative but not limitative. It should be noted that heavy lines in the accompanying drawings represent pipes, and "  " and "  " represent valves.

At least one embodiment of the present disclosure provides a coating apparatus. As illustrated in FIG. 1, the coating apparatus includes a supply device 10, a coater device 20 and a recycling device 30.

The supply device 10 is configured to provide a coating liquid (namely a liquid applied on a substrate for film coating) to the coater device 20, and includes a liquid inlet 10a, a liquid outlet 10b and a coating liquid supply unit 11. The coating liquid supply unit 11 is configured to store the coating liquid and connected with the liquid inlet 10a. For instance, the supply device 10 may also include a supply pump 12 (e.g., an injection pump) connected with the coating liquid supply unit 11. The supply pump 12 is connected with the liquid outlet 10b so as to provide the coating liquid from the coating liquid supply unit 11 to the coater device 20. In other embodiments of the present disclosure, the coating liquid in the coating liquid supply unit 11 may also be provided to the coater device 20 by other means. For example, a clean dry gas may be provided to the coating liquid supply unit 11, so as to provide the coating liquid in the coating liquid supply unit 11 to the coater device 20.

The coater device 20 is configured to coat a substrate to prepare a required film and includes a coating liquid nozzle 21. The coating liquid nozzle 21 includes a receiving opening 21a connected with the liquid outlet 10b of the supply device 10 to receive the coating liquid, a coating opening 21b configured to discharge the coating liquid to the substrate, and an exhaust opening 21c configured to discharge gas bubbles. For instance, the receiving opening 21a is disposed on the top of the coating liquid nozzle 21; the coating opening 21b is disposed at the bottom of the coating liquid nozzle 21; and the exhaust opening 21c is disposed on a lateral surface of the coating liquid nozzle 21. For instance, the coating liquid nozzle 21 may include a plurality of exhaust openings 21c to improve the bubble removal effect.

The recycling device 30 is at least configured to recycle the coating liquid from the exhaust opening 21c of the coater device 20, and includes at least one recycling inlet 30a (FIG. 1 takes one recycling inlet as an example) and a recycled liquid outlet 30b. The at least one recycling inlet 30a includes a supply process recycling inlet 3a. The supply process recycling inlet 3a is connected with the exhaust opening 21c of the coating liquid nozzle 21 to receive the coating liquid from the exhaust opening 21c. The recycled liquid outlet 30b is connected with the liquid inlet 10a of the supply device 10 to provide the coating liquid recycled to the supply device 10, so as to reutilize the coating liquid recycled for a subsequent coating operation.

In the bubble removal process of the coating liquid in the coating liquid nozzle, as the coating liquid discharged from the exhaust opening 21c of the coating liquid nozzle 21 along with the gas bubbles is recycled and reutilized, the waste of the coating liquid can be effectively reduced. In the cleaning process of the coating apparatus, the coating liquid from the exhaust opening 21c of the coating liquid nozzle 21 may also be recycled, so as to further reduce the waste of the coating liquid. On the other hand, pipes from the exhaust opening 21c of the coating liquid nozzle 21, to the recycling device 30 and then to the liquid inlet 10a of the supply device may be hermetically connected, so as to avoid the coating liquid recycled from making contact with the air and hence ensure the cleanness of the coating liquid.

For instance, as illustrated in FIG. 1, the coating liquid supply unit 11 of the supply device 10 may include a first supply container 111, a gas gathering container 113 and a second supply container 112 which are sequentially connected. The first supply container 111 is configured to store the coating liquid. For instance, the coating liquid in the first supply container 111 may be given a pressure by a clean dry gas (clear dry air, hereafter referred to as CDA) to enter the gas gathering container 113. For instance, the gas gathering container 113 includes a liquid inlet a and a liquid outlet c which are on the lower end of the gas gathering container 113, and an exhaust port b disposed on the upper end of the gas gathering container 113; and after the coating liquid in the first supply container 111 enters the gas gathering container 113 from the liquid inlet a, gas in the coating liquid gradually gathers at the top of the gas gathering container 113 and is discharged from the exhaust port b. The second supply container 112 includes a first inlet 112a, a second inlet 112b and an outlet 112c. The first inlet 112a is connected with the gas gathering container 113 to receive the coating liquid flowing out from the liquid outlet c of the gas gathering container 113; the second inlet 112b is connected with the liquid inlet 10a of the supply device 10 to receive the coating liquid recycled by the recycling device 30; and the outlet 112c is connected with the supply pump 12. For instance, the second supply container 112 may be subjected to CDA pressure to provide the coating liquid to the supply pump 12.

In the embodiment of the present disclosure, by adoption of the method of applying a pressure via CDA, the coating liquid in the first supply container and the second supply container can flow out continuously and stably. For instance, the second supply container 112 has buffer effect, so that the coating liquid flowing out from the first supply container 111 and the coating liquid flowing out from the second supply container 112 can have different velocities. For instance, the velocity of the coating liquid flowing out from the outlet 112c of the second supply container 112 may be greater than the velocity of the coating liquid flowing out from the first supply container 111.

For instance, the coating liquid supply unit 11 may include a plurality of first supply containers 111 (e.g., two first supply containers) and gas gathering containers 113 which are respectively and correspondingly connected with the plurality of the first supply containers 111. The arrangement of the plurality of the first supply containers 111 can avoid production break caused by the insufficient supply of the coating liquid.

For instance, as illustrated in FIG. 1, the coater device 20 may also include a bubble liquid (namely liquid containing bubbles) container 22. The bubble liquid container 22 is connected with the exhaust opening 21c of the coating liquid nozzle 21 and the supply process recycling inlet 3a of the recycling device 30, and configured to store the coating liquid flowing out from the exhaust opening 21c along with the gas bubbles. For instance, in a situation where the coating liquid nozzle 21 includes the plurality of exhaust openings 21c, the coater device 20 may include a plurality of bubble liquid containers 22 which are respectively connected with the exhaust openings 21c.

For instance, as illustrated in FIG. 1, the recycling device 30 may include a first recycling pump 341 and a first recycling container 31 which are connected with each other. The first recycling pump 341 is connected with the supply process recycling inlet 3a of the recycling device 30 and configured to pump the coating liquid from the exhaust opening 21c of the coating liquid nozzle 21 into the first recycling container 31. The first recycling container 31 is between the supply process recycling inlet 3a and the recycled liquid outlet 30b and configured to store the coating liquid from the exhaust opening 21c of the coating liquid nozzle 21. For instance, the coating liquid in the first recycling container 31 may continuously and stably enter the supply device 10 by adoption of CDA for the pressurizing of the first recycling container 31.

For instance, as illustrated in FIG. 1, the coating apparatus provided by at least one embodiment of the present disclosure may further include a waste device 70 configured to accommodate waste. The waste device 70 is connected with the recycled liquid outlet 30b of the recycling device 30. In a situation where the coating liquid recycled by the recycling device 30 is not required to be reutilized, a material in the recycling device 30 may be discharged to the waste device 70.

For instance, the waste device 70 may also be connected with the exhaust port b of the gas gathering container 113 and configured to discharge gas accumulated in the gas gathering container 113.

For instance, the waste device 70 may include a waste container 71 and waste pumps 72 which are respectively connected with an inlet and an outlet of the waste container 71. The waste pump 72 at the inlet of the waste container 71 is configured to pump a material in a device (e.g., the recycling device 30) connected with the waste pump 72 at the inlet of the waste container 71 into the waste container 71, and the waste pump 72 at the outlet of the waste container 71 is configured to pump out the waste in the waste container 71 and discharge the waste. The waste discharged by the waste device 70 may be processed according to production demands.

For instance, as illustrated in FIG. 1, the coating apparatus provided by at least one embodiment of the present disclosure may further include a supply pipe adapter 42 (e.g., a triple valve). The supply pipe adapter 42 is connected with the supply device 10, the recycling device 30 and the waste device 70, and configured to allow the recycled liquid outlet 30b of the recycling device 30 to be communicated with the liquid inlet 10a of the supply device 10 under a first state and hence allow the coating liquid recycled by the recycling device 30 to enter the supply device 10 to be reutilized, and allow the recycled liquid outlet 30b of the recycling device 30 to be communicated with the waste device 70 under a second state and hence allow a material in the recycling device 30 to be discharged to the waste device 70.

Figure 2:
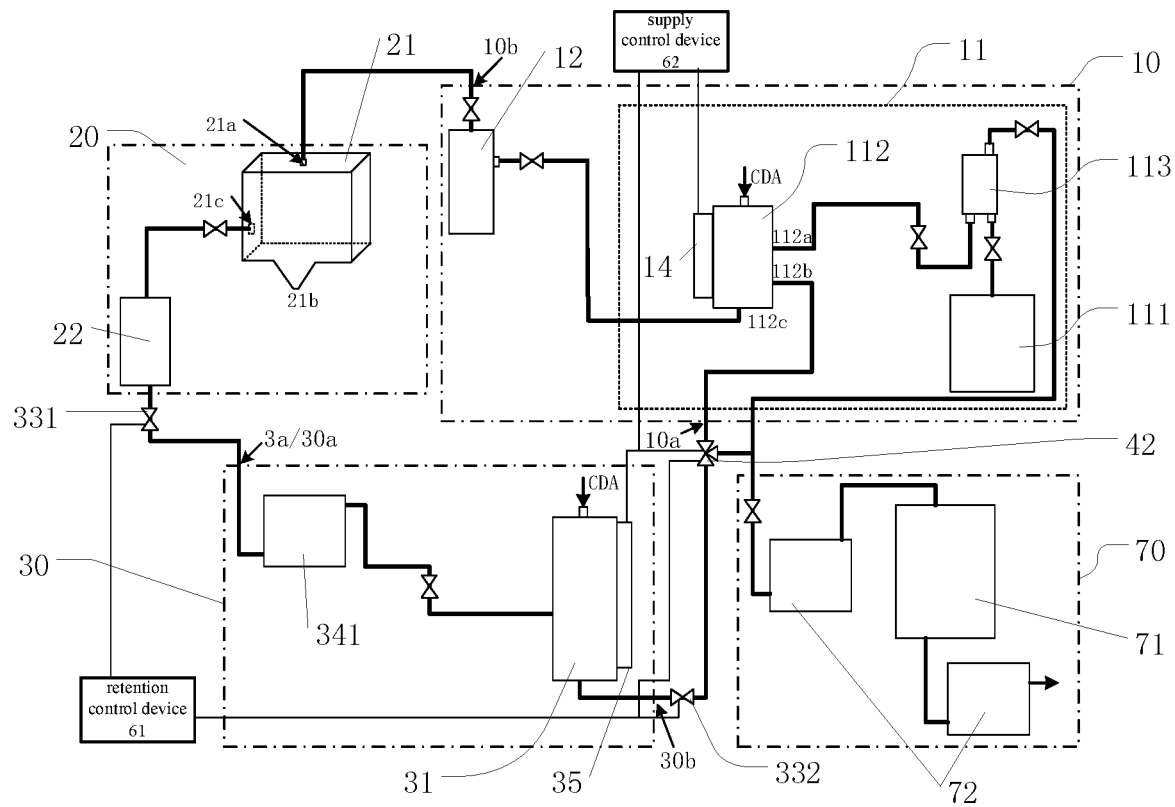
FIG. 2 is a second schematic structural view of the coating apparatus provided by an embodiment of the present disclosure.

For instance, as illustrated in FIG. 2, the coating apparatus provided by at least one embodiment of the present disclosure may further include a supply liquid level sensor 14, a recycled liquid level sensor 35 and a supply control device 62. The supply liquid level sensor 14 is configured to detect the liquid level of the coating liquid in the second supply container 112 of the coating liquid supply unit 11; the recycled liquid level sensor 35 is configured to detect the liquid level of the coating liquid recycled by the recycling device 30 (e.g., the coating liquid in the first recycling container 31); and the supply control unit 62 is configured to control the communication state between the recycled liquid outlet 30b of the recycling device 30 and the liquid inlet 10a of the supply device 10 according to detection results of the supply liquid level sensor 14 and the recycled liquid level sensor 35.

In the embodiment of the present disclosure, whether there is enough coating liquid in the second supply container 112 and the recycling device 30 may be respectively acquired through the supply liquid level sensor 14 and the recycled liquid level sensor 35. In a situation where the coating liquid needs to be supplied for the second supply container 112 and there is enough coating liquid in the recycling device 30, the supply control unit 62 controls the supply pipe adapter 42 to communicate the recycled liquid outlet 30*b* of the recycling device 30 with the liquid inlet 10*a* of the supply device 10, so as to provide the coating liquid recycled by the recycling device 30 to the second supply container 112. In the embodiment of the present disclosure, in a situation where the second supply container 112 requires supply, the coating liquid recycled by the recycling device 30 is used in priority, and the coating liquid in the first supply container 111 of the coating liquid supply unit 11 is used only in a situation where the coating liquid recycled by the recycling device 30 is insufficient, so as to avoid the deterioration of the coating liquid recycled by the recycling device 30 due to too long retention time.

For instance, as illustrated in FIG. 2, the coating apparatus provided by at least one embodiment of the present disclosure may further include a first electronic valve 331 disposed at the supply process recycling inlet 3*a*, a second electronic valve 332 disposed at the recycled liquid outlet 30*b*, and a retention control device 61 connected with the first and second electronic valves. The retention control unit 61 is configured to control the communication state between the recycled liquid outlet 30*b* of the recycling device 30 and the waste device 70 according to the working hours of the first electronic valve 331 and the second electronic valve 332.

In the embodiment of the present disclosure, the retention time of the coating liquid recycled by the recycling device 30 may be obtained by monitoring the working hours of the first and second electronic valves. If the retention time of the coating liquid exceeds a set duration (set as required), the coating liquid is considered to go bad and cannot be reutilized. In this case, the recycled liquid outlet 30*b* of the recycling device 30 is communicated with the waste device 70, and the coating liquid recycled by the recycling device 30 may be discharged to the waste device 70. If the retention time of the coating liquid does not exceed the set duration, the recycled liquid outlet 30*b* is communicated with the liquid inlet 10*a* of the supply device 10 to reutilize the coating liquid recycled by the recycling device 30 in a situation where the second supply container 112 of the coating liquid supply unit 11 requires the supply of the coating liquid.

For instance, both the specific structures of the supply control unit 62 and the retention control unit 61 may correspond to a processor. For instance, the processor may be an electronic component having processing function such as a central processing unit (CPU), a micro controller unit (MCU), a digital signal processor (DSP) and a programmable logic controller (PLC) or a collection of the electronic components.

Figure 3:
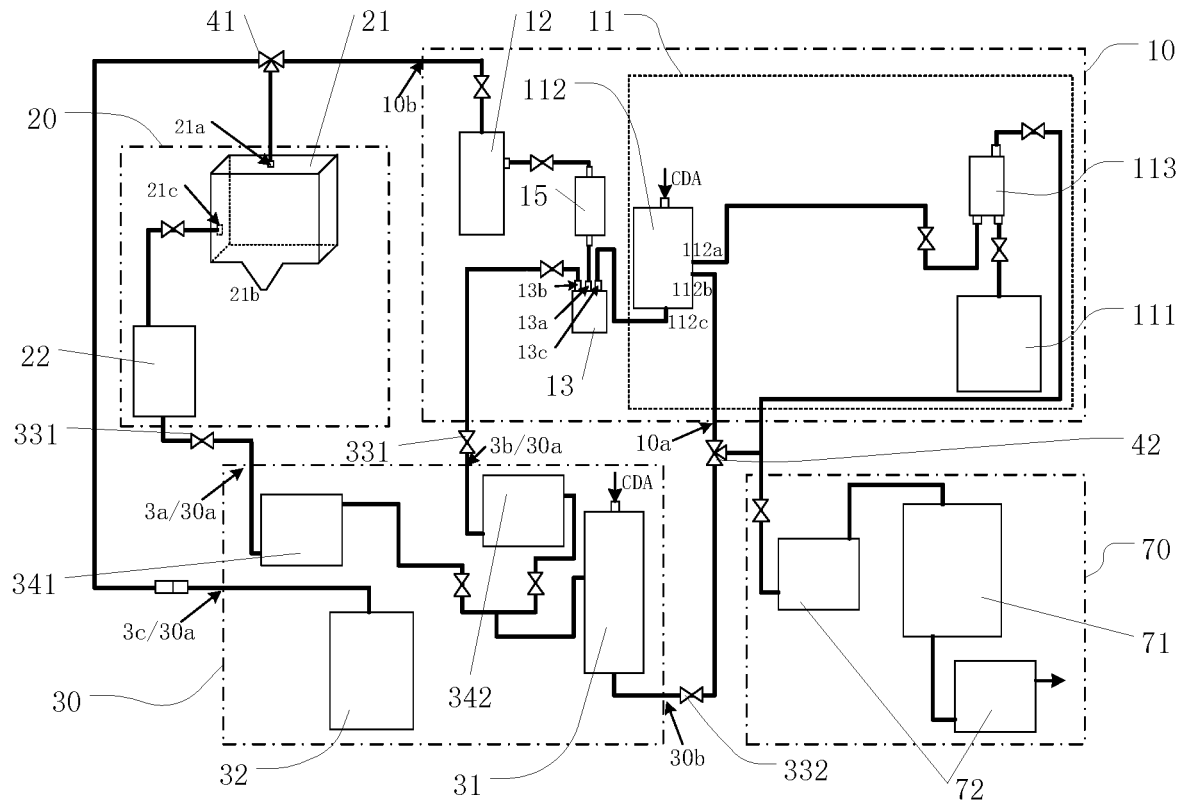
FIG. 3 is a third schematic structural view of the coating apparatus provided by an embodiment of the present disclosure.

For instance, as illustrated in FIG. 3, in the coating apparatus provided by at least one embodiment of the present disclosure, the supply device 10 may also include a filter 13 configured to filter the coating liquid from the coating liquid supply unit 11. The filter includes an inlet 13*c*, a first outlet 13*a* and a second outlet 13*b*. The inlet 13*c* is connected with the coating liquid supply unit 11 and configured to allow the coating liquid from the coating liquid supply unit 11 to enter the filter 13; the first outlet 13*a* is connected with the supply pump 12 and configured to allow a filtered coating liquid to enter the supply pump 12; and the second outlet 13*b* is connected with the recycling device 30, so that impurities such as particles and fibers in the coating liquid can be separated out and enter the recycling device 30 from the second outlet 13*b*. In the embodiment of the present disclosure, the waste of the coating liquid can be further reduced by recycling the coating liquid from the second outlet 13*b* of the filter 13.

For instance, the filter 13 may include a reticular filter membrane or the like to filter the impurities such as the particles or the fibers in the coating liquid.

For instance, pipes from the second outlet 13*b* of the filter 13, the recycling device 30 to the liquid inlet 10*a* of the supply device 10 may be hermetically connected, so as to avoid the coating liquid recycled from making contact with the air and hence to ensure the cleanness of the coating liquid.

For instance, as illustrated in FIG. 3, the second outlet 13*b* of the filter 13 and the exhaust opening 21*c* of the coating liquid nozzle 21 may be respectively connected with different recycling inlets 30*a* and different recycling pumps. For instance, the exhaust opening 21*c* of the coating liquid nozzle 21 is connected with the supply process recycling inlet 3*a* and then connected with the first recycling pump 341. The second outlet 13*b* of the filter 13 is connected with a recycling inlet 3*b* and then connected with a second recycling pump 342 (configured to pump the coating liquid from the second outlet 13*b* into the recycling device 30). Thus, the coating liquid from the coating liquid nozzle 21 and the coating liquid from the filter 13 can be respectively recycled at different periods, so that the pipe design can be simplified.

For instance, in a situation where the second outlet 13*b* of the filter 13 and the exhaust opening 21*c* of the coating liquid nozzle 21 are respectively connected with different recycling inlets 30*a*, as illustrated in FIG. 3, a first electronic valve 331 may be disposed at each recycling inlet 30*a*.

For instance, the coating liquid from the filter 13 and the coating liquid from the coating liquid nozzle 21 may be recycled into the same recycling container 31, and as illustrated in FIG. 2, the first recycling container 31 is configured to store the coating liquid from the exhaust opening 21*c* of the coating liquid nozzle 21 and the coating liquid from the second outlet 13*b* of the filter 13; or the coating liquid from the filter 13 and the coating liquid from the coating liquid nozzle 21 may also be respectively recycled into different recycling containers, so as to provide convenience for pipe design and ensure the consistent source of the coating liquid in the recycling containers.

For instance, as illustrated in FIG. 3, the supply device 10 may also include a degasser 15. An inlet of the degasser is connected with the first outlet 13*a* of the filter 13, and an outlet of the degasser is connected with the supply pump 12. The degasser 15 is configured to discharge gas bubbles in the coating liquid flowing into the supply pump 12 from the filter 13.

For instance, the degasser 15 may be a foam destroyer used in a coater device for performing defoaming treatment on a liquid by ultrasonic waves or other means.

For instance, as illustrated in FIG. 3, in at least one embodiment of the present disclosure, the at least one recycling inlet 30*a* of the recycling device 30 may also include a cleaning process recycling inlet 3*c*. The cleaning process recycling inlet 3*c* is connected with the liquid outlet 10b of the supply device 10. In the embodiment of the present disclosure, before the bubble removal treatment on the coating liquid in the coating liquid nozzle, the coating apparatus may also be subjected to a cleaning treatment. By arrangement of the cleaning process recycling inlet 3c, the coating liquid from the liquid outlet 10b of the supply device 10 in the cleaning process may be recycled, so as to further reduce the waste of the coating liquid.

For instance, as illustrated in FIG. 3, the recycling device 30 may include a first recycling container 31 and a second recycling container 32; the first recycling container 31 is disposed between the supply process recycling inlet 3a and the recycled liquid outlet 30b; and the second recycling container 32 is different from the first recycling container 31 and connected with the cleaning process recycling inlet 3c and configured to recycle the coating liquid in the cleaning process of the coating apparatus. As the cleaning process and the process of providing the coating liquid to the coating liquid nozzle are not performed simultaneously, the coating liquid in the cleaning process and the coating liquid in the process of providing the coating liquid to the coating liquid nozzle are respectively recycled into different containers, so as to ensure the consistent source of the coating liquid recycled in each of the containers and ensure the quality of the coating liquid recycled in each of the containers.

For instance, both the first recycling container 31 and the second recycling container 32 may adopt corrosion-resistant containers so as to prevent the containers from being corroded by the coating liquid.

For instance, as illustrated in FIG. 3, the coating apparatus provided by at least one embodiment of the present disclosure may further include a cleaning pipe adapter 41 (e.g., a triple valve or a pipe adapter) connected with the liquid outlet 10b of the supply device 10. The cleaning pipe adapter 41 is configured to allow the liquid outlet 10b of the supply device 10 to be communicated with the receiving opening 21a of the coating liquid nozzle 21 under a first state and hence allow the coating liquid from the supply device 10 to enter the coating liquid nozzle 21, and allow the second recycling container 32 to be communicated with the liquid outlet 10b of the supply device 10 under a second state so as to recycle the coating liquid from the liquid outlet 10b of the supply device in the cleaning process of the coating apparatus. It should be noted that: the description that the cleaning pipe adapter 41 includes the first state and the second state refers to that the cleaning pipe adapter has two different usage modes, and the first state and the second state are different from the first and second states of the supply pipe adapter 42.

For instance, the coating apparatus provided by at least one embodiment of the present disclosure may further include a supply position cleaner and a coating position cleaner. The supply position cleaner is configured to introduce a cleaning agent (a substance used for cleaning, such as a gas or a liquid) into the coating apparatus from the supply position, and for instance, is connected with the gas gathering container of the supply device. The coating position cleaner is configured to introduce a cleaning agent into the coating apparatus from the bubble liquid container of the coater device. For instance, both the supply position cleaner and the coating position cleaner may include a cleaning agent supply pipe for introducing the cleaning agent and a valve disposed at the cleaning agent supply pipe. Description will be given below to the supply position cleaner and the coating position cleaner with reference to FIGS. 4a and 4b respectively.

Figure 4A:
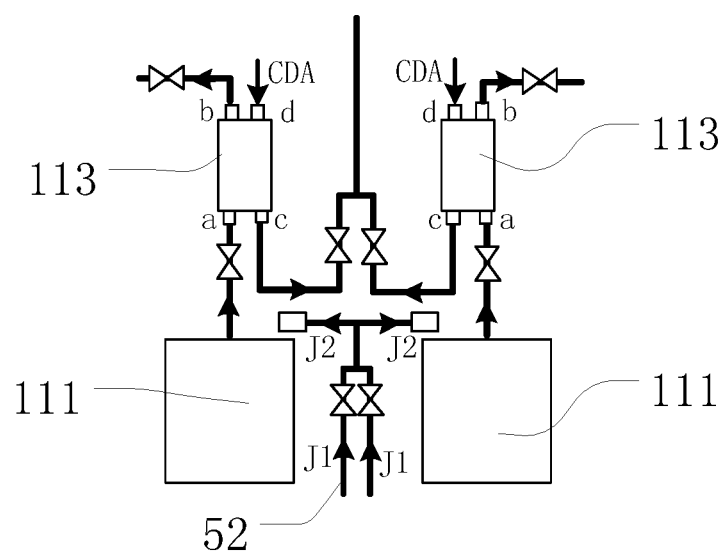
FIG. 4a is a schematic structural view of a supply position cleaner in the coating apparatus provided by an embodiment of the present disclosure.

For instance, as illustrated in FIG. 4a, the coating apparatus provided by at least one embodiment of the present disclosure may include a supply position cleaner 52. The supply position cleaner is configured to provide a cleaning agent to the gas gathering container 113 so as to clean a pipe from the gas gathering container 113 to the liquid outlet of the supply device. For instance, the supply position cleaner 52 may include pipes J1 and J2 and a valve disposed between the pipes J1 and J2. In a situation where the coating apparatus is required for cleaning, the first supply container 111 and the liquid inlet a of the gas gathering container 113 are disconnected; the pipe J2 may be connected with the liquid inlet a; and the cleaning agent is introduced into the pipe J1, flows out from the liquid outlet c of the gas gathering container 113, and enters the second supply container (not shown in FIG. 4a).

Description is given in FIG. 4a by taking two first supply containers 111 and two gas gathering containers 113 as an example. Correspondingly, the supply position cleaner 52 includes two pipes J1 and two pipes J2. Of course, both the number of the first supply containers 111 and the number of the gas gathering container s113 may also be one.

For instance, the supply position cleaner 52 may also be connected with an air inlet d on the upper end of the gas gathering container 113, so as to introduce the cleaning agent into the air inlet d.

Figure 4B:
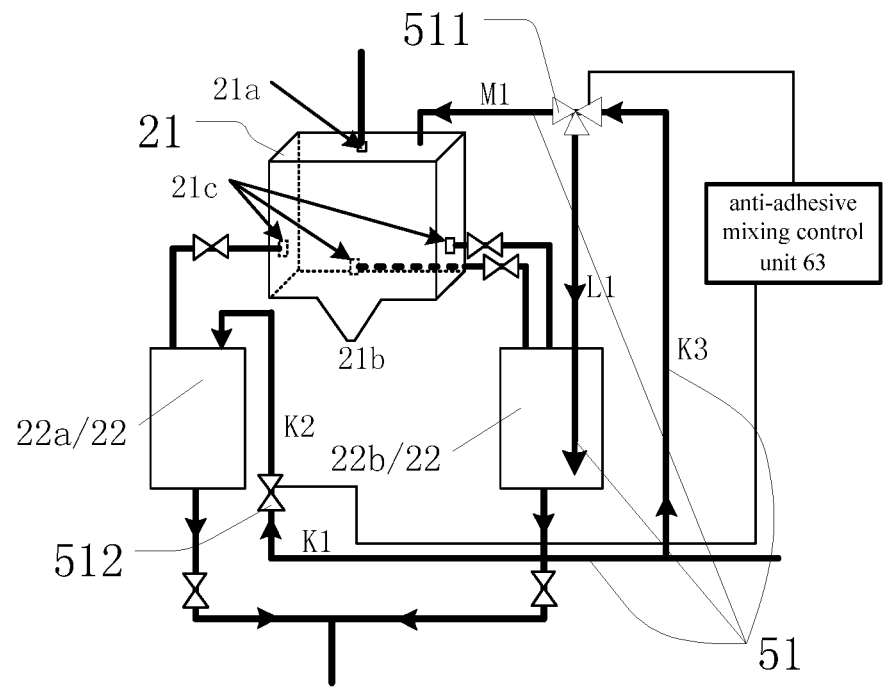
FIG. 4b is a schematic structural view of a coating position cleaner in the coating apparatus provided by an embodiment of the present disclosure.

For instance, as illustrated in FIG. 4b, the coating apparatus provided by at least one embodiment of the present disclosure may include a coating position cleaner 51. The coating position cleaner 51 is configured to provide a cleaning agent to the bubble liquid container 22 in the coater device. For instance, the coating position cleaner 51 is also configured to provide a cleaning agent to the coating liquid nozzle 21 in the coater device.

Description is given in FIG. 4b by taking the connection between the coating liquid nozzle 21 and two bubble liquid containers 22 as an example.

For instance, as for a first bubble liquid container 22a, the coating position cleaner 51 may include pipes K1 and K2 which are mutually connected, and an electronic valve 512 disposed between the pipes K1 and K2; the pipe K2 is connected with the first bubble liquid container 22a; and in a situation where the pipes K1 and K2 are communicated through the electronic valve 512, the cleaning agent is introduced into the pipe K1, enters the first bubble liquid container 22a along the pipe K2, and is discharged from an outlet on the lower end of the first bubble liquid container 22a, so as to clean the first bubble liquid container 22a.

For instance, as for the second bubble liquid container 22b and the coating liquid nozzle 21, the coating position cleaner 51 may include a pipe K3 and pipes M1 and L1 connected with the pipe K3. For instance, the pipes K3, M1 and L1 may all be connected with a triple valve 511; the pipe M1 is connected with the coating liquid nozzle 21; and the pipe L1 is connected with the second bubble liquid container 22b. In a situation where the pipes K3 and M1 are communicated through the triple valve 511, the cleaning agent entering the pipe K3 flows out from the coating opening 21b of the coating liquid nozzle 21, so as to clean the coating liquid nozzle 21. In a situation where the pipes K3 and L1 are communicated through the triple valve 511, the cleaning agent entering the pipe K3 flows out from an outlet on the lower end of the second bubble liquid container 22b, so as to clean the second bubble liquid container 22b.

It should be noted that the connection of the pipes M1, L1 and K3 may also not adopt the triple valve, and the pipes M1 and L1 are respectively connected with different pipes K3;

and in addition, in at least one embodiment of the present disclosure, the coater device may also only include the first bubble liquid container 22a or the second bubble liquid container 22b.

For instance, as illustrated in FIG. 4b, the coating apparatus provided by at least one embodiment of the present disclosure may further include an anti-adhesive mixing control unit 63 which is configured to control the communication state between the recycled liquid outlet of the recycling device and the liquid inlet of the supply device according to the on/off state of the electronic valve (with reference to the electronic valve 512 and the triple valve 511) at the cleaning agent supply pipe of the bubble liquid container 22. In the embodiment of the present disclosure, in a situation where a liquid cleaning agent is introduced into the bubble liquid container 22, the anti-adhesive mixing control unit 63 controls the recycled liquid outlet of the recycling device and the liquid inlet of the supply device to be not communicated by monitoring the state of the electronic valve at the cleaning agent supply pipe of the bubble liquid container 22, so as to prevent the adhesive mixing phenomenon caused due to the reason that the liquid cleaning agent enters the supply device.

For instance, the specific structure of the anti-adhesive mixing control unit 63 may correspond to a processor. For instance, the processor may be an electronic component having processing function such as a CPU, an MCU, a DSP and a PLC or a collection of the electronic components.

Figure 5:
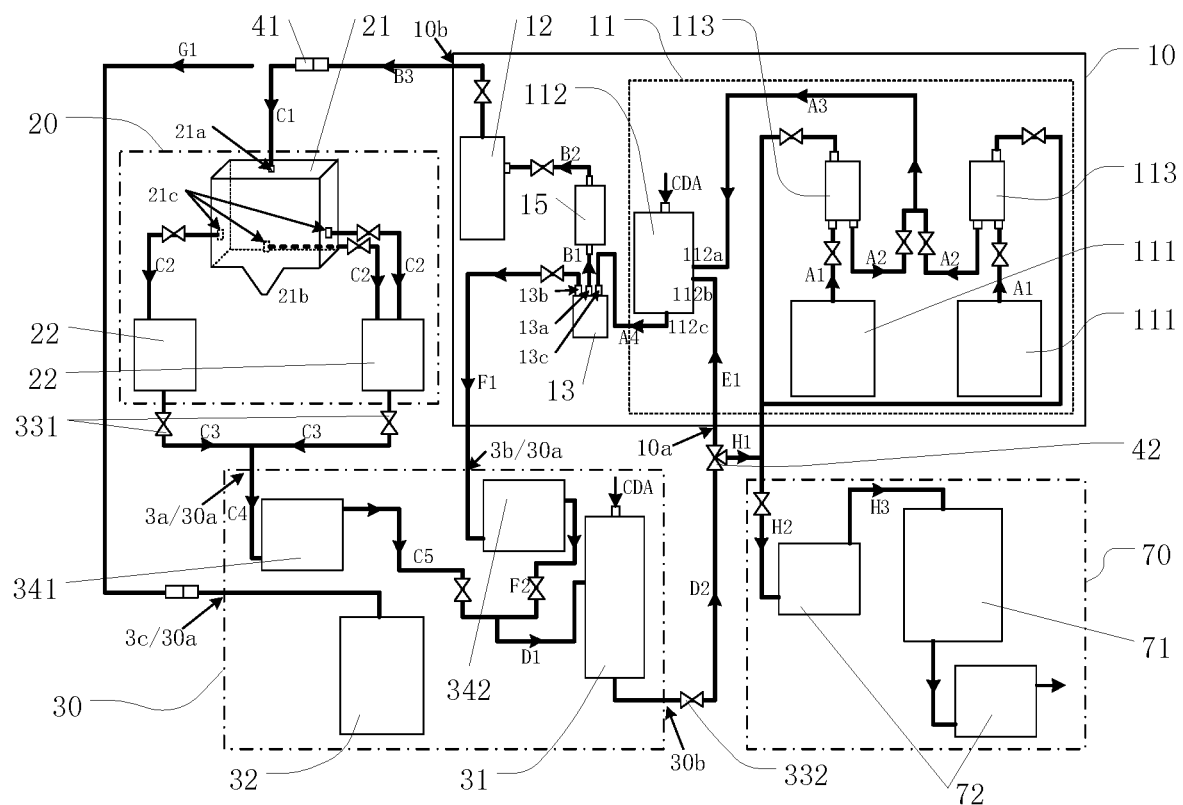
FIG. 5 is a schematic diagram of a recycling path and a cleaning path in the coating apparatus provided by an embodiment of the present disclosure.

Detailed description will be given below to the use process of the coating apparatus provided by the embodiment of the present disclosure with reference to FIG. 5. For instance, the use process of the coating apparatus includes the following steps S51 to S53.

S51: performing integral cleaning on the coating apparatus. For instance, the step S51 may include a coating liquid discharge process S511, a liquid cleaning process S512 and a gas cleaning process S513 which are executed in sequence. Detailed description will be given below.

S511: coating liquid discharge process, namely the process of integrally discharging the coating liquid in the coating apparatus. For instance, the process S511 includes the following steps S511a-S511e.

S511a: adopting the cleaning pipe adapter 41 to communicate the liquid outlet 10b of the supply device 10 and the cleaning process recycling inlet 3c of the recycling device 30, namely communicate pipes B3 and G1.

S511b: recycling the coating liquid in a path from the gas gathering container 113 to the supply pump 12 into the second recycling container 32 of the recycling device 30 along pipes A1-A2-A3-A4-B1-B2-B3-G1. For instance, in this step, recycling power is provided by introducing gas (for instance, CDA) into the gas gathering container 113 by utilization of the supply position cleaner 52 as illustrated in FIG. 4a.

S511c: recycling the coating liquid in the bubble liquid container 22 into the first recycling container 31 along pipes C3-C4-C5-D1. For instance, recycling power is provided by the introduction of gas (for instance, CDA) into the bubble liquid container 22 via the coating position cleaner 51 as illustrated in FIG. 4b, or by adoption of the first recycling pump 341.

S511d: recycling the coating liquid in the filter 13 into the first recycling container 31 along pipes F1-F2-D1. For instance, in this step, recycling power is provided by utilization of the second recycling pump 342.

S511e: recycling the coating liquid in the first recycling container 31 into the second recycling container 32 along pipes D2-E1-A4-B1-B2-B3-G1. In this step, the supply pipe adapter 42 allows the recycled liquid outlet 30b of the recycling device 30 to be communicated with the liquid inlet 10a of the supply device 10. For instance, in this step, recycling power is provided by introducing gas (for instance, CDA) into the first recycling container 31.

It should be noted that the sequence of the steps S511b to S511d may be adjusted as required. For instance, the sequence of the steps S511c and S511d may be exchanged, and the sequence of the steps S511b and S511c or S511d may be exchanged.

S512: liquid cleaning process, namely the process of integrally cleaning the coating apparatus by introducing a liquid into the coating apparatus. In this step, the liquid outlet 10b of the supply device 10 and the coating liquid nozzle 21 are communicated (namely pipes B3 and C1 are communicated) through the cleaning pipe adapter 41, and a liquid cleaning agent is introduced into the supply device 10 and the bubble liquid container 22 of the coater device 20. For instance, the liquid cleaning agent is introduced into the supply device 10 (e.g., the gas gathering container 113) by utilization of the supply position cleaner 52 as illustrated in FIG. 4a. For instance, the liquid cleaning agent is introduced into the bubble liquid container 22 of the coater device 20 by utilization of the coating position cleaner 51 as illustrated in FIG. 4b.

In the step S512, the supply pipe adapter 42 allows the recycling device 30 and the waste device 70 to be communicated and allows the recycling device 30 and the supply device 10 to be not communicated, namely pipes D2 and H1 are communicated but pipes D2 and E1 are disconnected, so that the waste in the coating apparatus can finally enter the waste device 70, for instance, entering the waste container 71 from the recycled liquid outlet 30b of the recycling device 30 along pipes D2-H1-H2-H3.

S513: gas cleaning process, namely the process of removing the liquid cleaning agent in the coating apparatus by introducing gas into the coating apparatus. For instance, in a situation where the liquid outlet 10b of the supply device 10 and the coating liquid nozzle 21 are communicated with each other, a gas (e.g., CDA) is introduced into the supply device 10 (e.g., the gas gathering container 113 in the supply device 10) and the bubble liquid container 22 of the coater device 20. In the step S513, the supply pipe adapter 42 allows the recycling device 30 and the waste device 70 to be communicated but allows the recycling device 30 and the supply device 10 to be not communicated, so that the waste in the coating apparatus can finally enter the waste device 70.

S52: providing the coating liquid to the coating liquid nozzle 21 by utilization of the supply device 10. In this step, the cleaning pipe adapter 41 allows the supply device 10 and the coating liquid nozzle 21 to be communicated; the valve at the exhaust opening 21c of the coating liquid nozzle 21 is switched on, and gas bubbles are discharged from the exhaust opening 21c (namely bubble removal process); and meanwhile, for instance, the coating liquid discharged from the exhaust opening 21c along with the gas bubbles is recycled by utilization of the recycling device 30 along pipes C2-C3-C4-C5-D1. For instance, recycling power is provided by utilization of the first recycling pump 341.

For instance, in the step S52, the coating liquid from the second outlet 13b of the filter 13 may also be recycled into the first recycling container 31 along pipes F1-F2-D1.

S53: forming a required film by allowing the coating opening 21h of the coating liquid nozzle 21 to discharge the coating liquid to a substrate. In this step, the valve at the exhaust opening 21c of the coating liquid nozzle 21 is switched off, so that the coating liquid in the coating liquid nozzle 21 cannot flow out from the exhaust opening 21c, and the recycling device 30 does not execute the recycling operation.

For instance, in the step S53, the coating operation may be performed on a plurality of substrates. For instance, the coating operation is performed to 500 substrates or substrates of other numbers.

The steps after the step S53 may include the following cases.

First case: after a certain number of films are prepared by utilization of the coating liquid nozzle 21, if the coating liquid nozzle 21 or the bubble liquid container 22 is polluted, the coating liquid nozzle 21 or the bubble liquid container 22 may be subjected to local cleaning. As the coating liquid at the positions of the coating liquid nozzle 21 and the bubble liquid container 22 tends to be polluted, compared with the means of performing integral cleaning on the coating apparatus, the local cleaning of the positions can improve the cleaning efficiency.

In the first case, for instance, the local cleaning of the coating liquid nozzle 21 includes: introducing a liquid cleaning agent into the coating liquid nozzle 21, and subsequently, introducing a gas into the coating liquid nozzle 21 to remove the liquid cleaning agent.

In the first case, for instance, the local cleaning of the bubble liquid container 22 includes: recycling the coating liquid in the bubble liquid container 22 into the first recycling container 31, in which, for instance, recycling power is provided by utilization of the first recycling pump 341; then, introducing a liquid cleaning agent into the bubble liquid container 22, in which the liquid cleaning agent enters the recycling device 30 and then enters the waste device 70; and afterwards, introducing a gas into the bubble liquid container 22 to remove the liquid cleaning agent, in which process, a material from the bubble liquid container 22 enters the waste device 70.

Second case: after a certain number of films are prepared by utilization of the coating liquid nozzle 21, if the coating liquid in the coating liquid nozzle 21 is insufficient, the coating liquid is supplied to the coating liquid nozzle 21 by utilization of the supply device 10, and subsequently, the film preparation is continuously performed by utilization of the coating liquid nozzle 21 (with reference to the step S53).

Third case: after a certain number of films are prepared by utilization of the coating liquid nozzle 21, if the coating liquid needs to be replaced, the coating apparatus is subjected to the integral cleaning (with reference to the step S51); then, a new coating liquid is supplied to the coating liquid nozzle 21 by utilization of the supply device 10 (with reference to the step S52); and subsequently, a film is prepared by utilization of the coating liquid nozzle 21 (with reference to the step S53).

At least one embodiment of the present disclosure further provides a method for recycling a coating liquid by utilization of the coating apparatus provided by any one of the above embodiments. Taking the coating apparatus illustrated in FIG. 1 as an example, the method includes: adopting the recycling device 30 to recycle the coating liquid flowing out from the exhaust opening 21c of the coating liquid nozzle 21; and providing the coating liquid recycled by the recycling device 30 to the supply device 10.

The method provided by the embodiment of the present disclosure may recycle the coating liquid from the exhaust opening of the coating liquid nozzle in the cleaning process of the coating apparatus and/or in the process of providing the coating liquid to the coating liquid nozzle, and provide the coating liquid recycled to the coating liquid supply device again for a subsequent coating operation, and hence can reduce the waste of the coating liquid. On the other hand, sealed pipes may be provided from the exhaust opening of the coating liquid nozzle to the liquid inlet of the supply device, the coating liquid recycled does not make contact with air, so high cleanness can be achieved.

For instance, as illustrated in FIG. 3, the supply device 10 may also include a filter 13. The filter includes an inlet 13c, a first outlet 13a and a second outlet 13b. The inlet 13c is connected with the coating liquid supply unit 11; the first outlet 13a is connected with the supply pump 12; and the second outlet 13b is connected with the recycling device 30. In this case, the method provided by at least one embodiment of the present disclosure may further include: adopting the recycling device 30 to recycle the coating liquid flowing out from the second outlet 13b of the filter 13. In the embodiment of the present disclosure, the coating liquid from the second outlet 13b of the filter 13 may be recycled in the cleaning process of the coating apparatus and/or in the process of providing the coating liquid to the coating liquid nozzle, so as to further reduce the waste of the coating liquid.

For instance, as illustrated in FIG. 3, the at least one recycling inlet 30a of the recycling device 30 may also include a cleaning process recycling inlet 3c. The cleaning process recycling inlet 3c is connected with the liquid outlet 10b of the supply device 10. In this case, the method provided by at least one embodiment of the present disclosure may further include: adopting the cleaning process recycling inlet 3c of the recycling device 30 to recycle the coating liquid from the liquid outlet 10b of the supply device 10. For instance, in the method provided by at least one embodiment of the present disclosure, a gas is introduced into the supply device 10, and the coating liquid from the liquid outlet 10b of the supply device 10 is recycled by utilization of the cleaning process recycling inlet 3c of the recycling device 30 (for instance, referring to the step S511b); and subsequently, a liquid cleaning agent is introduced into the supply device 10 (for instance, referring to the step S512). In the embodiment of the present disclosure, the waste of the coating liquid can be further reduced by recycling the coating liquid in the cleaning process of the coating apparatus.

At least one embodiment of the present disclosure further provides a method for cleaning the coating apparatus provided by any one of the above embodiments. Taking the coating apparatus illustrated in FIG. 1 as an example, the cleaning method includes: adopting the recycling device 30 to recycle the coating liquid from at least one of the supply device 10 or the coater device 20; and subsequently, introducing a liquid cleaning agent into the at least one of the supply device 10 or the coater device 20 correspondingly.

The cleaning method provided by the embodiment of the present disclosure can reduce the waste of the coating liquid by recycling the coating liquid in the cleaning process of the coating apparatus. On the other hand, sealed pipes may be provided from the supply device and/or the coater device 20 to the recycling device 30, the coating liquid recycled does not make contact with air, so high cleanness can be achieved.

For instance, in the cleaning method provided by at least one embodiment of the present disclosure, in a situation where the coater device 20 includes the bubble liquid container 22, adopting the recycling device 30 to recycle the coating liquid from the coater device 20 includes: adopting the recycling device 30 to recycle the coating liquid from the bubble liquid container 22 (with reference to the steps S511c and S52 in the embodiment of the coating apparatus).

For instance, in the cleaning method provided by at least one embodiment of the present disclosure, in a situation where the supply device 10 of the coating apparatus includes the filter 13 as illustrated in FIG. 3, adopting the recycling device 30 to recycle the coating liquid from the supply device 10 includes: adopting the recycling device 30 to recycle the coating liquid from the second outlet 13b of the filter 13 (with reference to the step S511d in the embodiment of the coating apparatus).

For instance, in the cleaning method provided by at least one embodiment of the present disclosure, in a situation where the liquid outlet 10b of the supply device 10 of the coating apparatus is connected with the cleaning process recycling inlet 3c (as illustrated in FIG. 3) of the recycling device 30, adopting the recycling device 30 to recycle the coating liquid from the supply device 10 includes: adopting the cleaning process recycling inlet of the recycling device 30 to recycle the coating liquid from the liquid outlet 10b of the supply device 10 (with reference to the steps S511b and S511e in the embodiment of the coating apparatus).

The cleaning method provided by the embodiment of the present disclosure may refer to the integral cleaning mode (with reference to the steps S511 to S513) and the local cleaning mode in the embodiments of the coating apparatus. Repeated descriptions are omitted herein.

Figure 6:
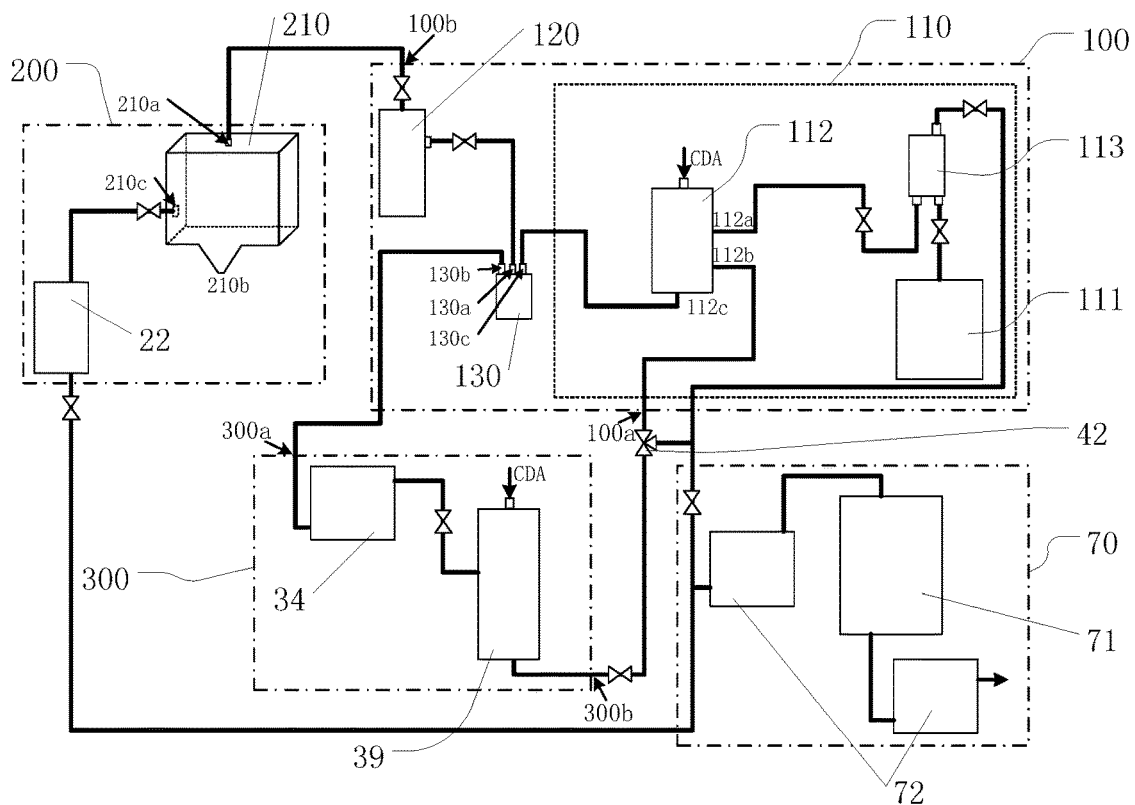
FIG. 6 is a schematic structural view of another coating apparatus provided by an embodiment of the present disclosure.

At least one embodiment of the present disclosure further provides a coating apparatus. As illustrated in FIG. 6, the coating apparatus includes a supply device 100 for supplying a coating liquid, a coater device 200 for film coating, and a recycling device 300 for recycling the coating liquid. The supply device 100 includes a liquid inlet 100a, a liquid outlet 100b, a coating liquid supply unit 110, a filter 130 and a supply pump 120 which are sequentially connected; the coating liquid supply unit 110 is connected with the liquid inlet 100a; the supply pump 120 is connected with the liquid outlet 100b; the filter 130 includes an inlet 130c, a First outlet 130a and a second outlet 130b; the inlet 130c is connected with the coating liquid supply unit 110; and the first outlet 130a is connected with the supply pump 120. The coater device 200 includes a coating liquid nozzle 210; the coating liquid nozzle 210 includes a receiving opening 210a, a coating opening 210b and an exhaust opening 210c; and the receiving opening 210a of the coating liquid nozzle 210 is connected with the liquid outlet 100b of the supply device 100. The recycling device 300 includes a supply process recycling inlet 300a and a recycled liquid outlet 300b; the supply process recycling inlet 300a is connected with the second outlet 130b of the filter 130; and the recycled liquid outlet 300b is connected with the liquid inlet 100a of the supply device 100.

The coating apparatus provided by the embodiment of the present disclosure may recycle the coating liquid from the filter 130 and provide the coating liquid recycled to the coating liquid supply device again for a subsequent coating operation, and hence can reduce the waste of the coating liquid. On the other hand, sealed pipes are provided from the second outlet 130b of the filter 130 to the supply process recycling inlet 300a of the recycling device 300, the coating liquid recycled does not make contact with air, so high cleanness can be achieved.

For instance, the coating liquid supply unit 110 may include a first supply container 111, a gas gathering container 113 and a second supply container 112 which are sequentially connected. For instance, the coater device 200 may include a bubble liquid container 22 connected with the exhaust opening 210c of the coating liquid nozzle 210. For instance, the coating apparatus provided by at least one embodiment of the present disclosure may further include a waste device 70. The waste device, for instance, includes two waste pumps 72 and a waste container 71 between the two waste pumps. For instance, the recycling device 300 may include a recycling pump 34 and a recycling container 39 which are mutually connected. The recycling pump 34 is configured to pump the coating liquid from the second outlet 130b of the filter 130 into the recycling container 39.

The coating apparatus provided by the embodiments of the present disclosure may refer to relevant description in the embodiments of the coating apparatus illustrated in FIG. 1. Repeated descriptions are omitted herein.

In summary, in any one of the above embodiments of the present disclosure, the coating liquid is recycled and the coating liquid recycled is provided for the coating liquid supply device again for a subsequent coating operation, so that the waste of the coating liquid can be reduced.

Figure 7:
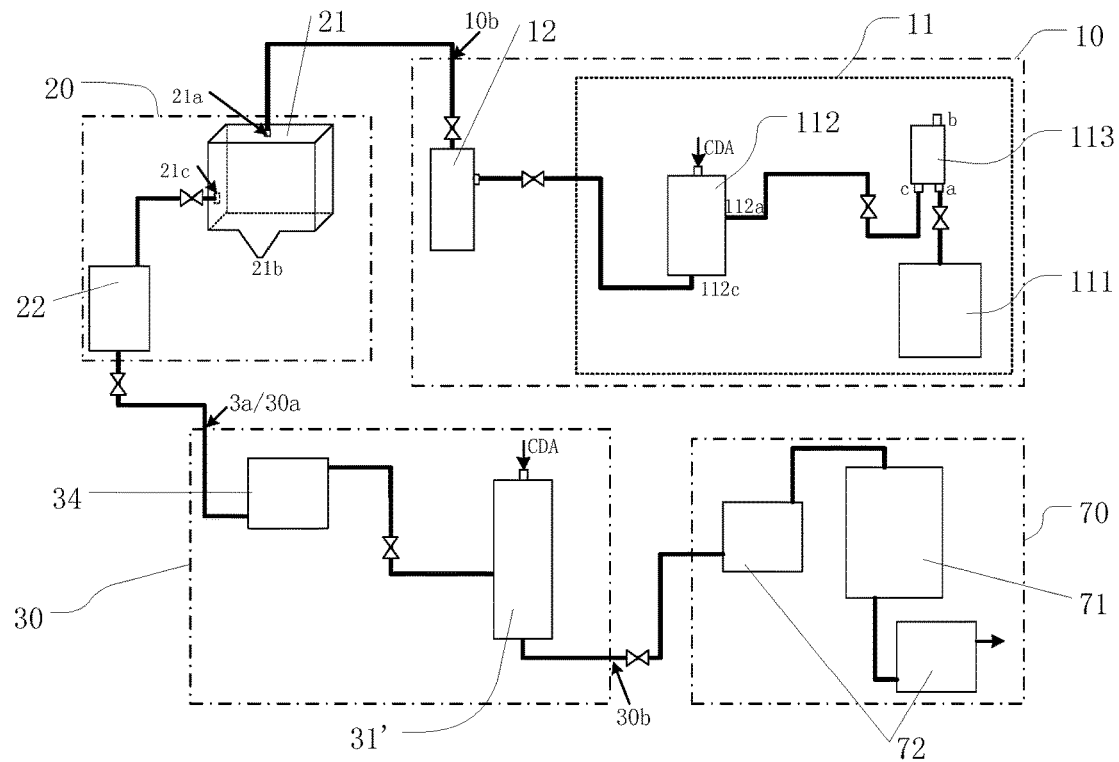
FIG. 7 is a schematic structural view of a further coating apparatus provided by an embodiment of the present disclosure.

At least one embodiment of the present disclosure provides a coating apparatus. As illustrated in FIG. 7, the coating apparatus includes a supply device 10, a coater device 20 and a recycling device 30. The supply device 10 is configured to provide a coating liquid to the coater device 20, and includes a liquid outlet 10b. The coater device 20 includes a coating liquid nozzle 21. The coating liquid nozzle 21 includes a receiving opening 21a, a coating opening 21b and an exhaust opening 21c, and the receiving opening 21a of the coating liquid nozzle 21 is connected with the liquid outlet 10b of the supply device 10 to receive the coating liquid from the liquid outlet 10b of the supply device 10. The recycling device 30 includes a recycled liquid outlet 30b, at least one recycling inlet 30a and a recycling container 31' (for example, the above first recycling container 31). The at least one recycling inlet 30a includes a supply process recycling inlet 3a. The supply process recycling inlet 3a is connected with the exhaust opening 21c of the coating liquid nozzle 21. The recycling container 31' is between the supply process recycling inlet 3a and the recycled liquid outlet 30b to contain the coating liquid recycled from the exhaust opening 21c in a bubble removal process.

The coating apparatus provided by the embodiment of the present disclosure can reduce the waste of the coating liquid by recycling the coating liquid from the exhaust opening 21c in the bubble removal process performed on the coating liquid in the coating liquid nozzle 21. On the other hand, connection pipes between the supply device 10, the coater device 20 and the recycling device 30 may be sealed, so that the coating liquid recycled does not make contact with air, and thus high cleanness can be achieved.

For instance, the supply device 10 includes a coating liquid supply unit 11 and a supply pump 12 connected with the coating liquid supply unit 11, and the coating liquid supply unit 11 may include a first supply container 111, a gas gathering container 113 and a second supply container 112 which are sequentially connected.

For instance, the coater device 20 may include a bubble liquid container 22 connected with the exhaust opening 21c of the coating liquid nozzle 21.

For instance, the coating apparatus provided by at least one embodiment of the present disclosure may further include a waste device 70 which, for instance, includes two waste pumps 72 and a waste container 71 between the two waste pumps 72.

For instance, the recycling device 30 may include a recycling pump 34 connected with the recycling container 31'. The recycling pump 34 is configured to pump the coating liquid from the exhaust opening 21c into the recycling container 31'.

The coating apparatus provided by the embodiments of the present disclosure may refer to relevant description in the embodiments of the coating apparatus illustrated in FIG. 1. Repeated descriptions are omitted herein.

There are the following points to be noted: (1) in the drawings of the embodiments of the present disclosure, only the structures related to the embodiments of the present disclosure are referred to, and other structures may be referred to conventional designs; and (2) in the case of no conflict, the features of the embodiments and the embodiments of the present disclosure may be combined with each other.

What are described above is related to the illustrative embodiments of the disclosure only and not limitative to the scope of the disclosure; the scopes of the disclosure are defined by the accompanying claims.

What is claimed is:

1. A coating apparatus, comprising: a supply device comprising a liquid inlet, a liquid outlet and a coating liquid supply unit, wherein the coating liquid supply unit is connected with the liquid inlet;
   a coater device comprising a coating liquid nozzle, wherein the coating liquid nozzle comprises a receiving opening, a coating opening and an exhaust opening, and the receiving opening of the coating liquid nozzle is configured to be connected with the liquid outlet of the supply device; and
   a recycling device comprising a recycled liquid outlet and at least one recycling inlet, wherein the at least one recycling inlet comprises a supply process recycling inlet which is indirectly connected with the exhaust opening of the coating liquid nozzle, and the recycled liquid outlet is configured to be connected with the liquid inlet of the supply devices,
   wherein the coater device further comprises a bubble liquid container, the bubble liquid container is connected with the exhaust opening of the coating liquid nozzle and the supply process recycling inlet, and the bubble liquid container is configured to store a coating liquid from the exhaust opening of the coating liquid nozzle;
   the recycling device comprises a first recycling pump and a first recycling container which are connected with each other, the first recycling pump is connected with the supply process recycling inlet and configured to pump the coating liquid from the bubble liquid container into the first recycling container, and the first recycling container is connected with the recycled liquid outlet;
   the coating liquid supply unit comprises a first supply container, a gas gathering container and a second supply container which are connected in sequence, the second supply container comprises a first inlet, a second inlet and an outlet, the first inlet is connected with the gas gathering container, and the second inlet is connected with the liquid inlet of the supply device;
   the gas gathering container comprises a liquid inlet and a liquid outlet which are at a lower end of the gas gathering container, and comprises an exhaust port at an upper end of the gas gathering container, the liquid inlet of the gas gathering container is connected with the first supply container, the liquid outlet of the gas gathering container is connected with the first inlet of the second supply container, and the gas gathering container is configured to allow a gas in the coating liquid to gather at a top of the gas gathering container and to be discharged from the exhaust port of the gas gathering container.

2. The coating apparatus according to claim 1, wherein the supply device further comprises a supply pump connected with the coating liquid supply unit, and the supply pump is connected with the liquid outlet of the supply device.

3. The coating apparatus according to claim 2, wherein the supply device further comprises a liter which comprises an inlet of the filter, a first outlet of the filter and a second outlet of the filter; the inlet of the filter is connected with the coating liquid supply unit; the first outlet of the filter is connected with the supply pump; and the second outlet of the filter is connected with the recycling device.

4. The coating apparatus according to claim 1, wherein the at least one recycling inlet of the recycling device further comprises a cleaning process recycling inlet, and the cleaning process recycling inlet is configured to be connected with the liquid outlet of the supply device.

5. The coating apparatus according to claim 4, wherein the recycling device comprises:
   a first recycling container between the supply process recycling inlet and the recycled liquid outlet; and
   a second recycling container different from the first recycling container and connected with the cleaning process recycling inlet.

6. The coating apparatus according to claim 5, further comprising a cleaning pipe adapter connected with the liquid outlet of the supply device, wherein the cleaning pipe adapter is configured to allow the liquid outlet of the supply device to be communicated with the receiving opening of the coating liquid nozzle under a first state, and allow the second recycling container to be communicated with the liquid outlet of the supply device under a second state.

7. The coating apparatus according to claim 1, further comprising a waste device, wherein the waste device is configured to be connected with the recycled liquid outlet of the recycling device.

8. The coating apparatus according to claim 7, further comprising a supply pipe adapter, wherein the supply pipe adapter is connected with the supply device, the recycling device and the waste device and configured to allow the recycled liquid outlet of the recycling device to be communicated with the liquid inlet of the supply device under a first state, and allow the recycled liquid outlet of the recycling device to be communicated with the waste device under a second state.

9. The coating apparatus according to claim 7, further comprising:
   a first electronic valve at the supply process recycling inlet of the recycling device;
   a second electronic valve at the recycled liquid outlet of the recycling device; and
   a retention control device configured to control a communication state between the recycled liquid outlet of the recycling device and the waste device according to working hours of the first electronic valve and the second electronic valve.

10. The coating apparatus according to claim 2, wherein the coating liquid supply unit comprises a first supply container, a gas gathering container and a second supply container which are connected in sequence; the second supply container comprises a first inlet, a second inlet and an outlet; the first inlet is connected with the gas gathering container; the second inlet is connected with the liquid inlet of the supply device; and the outlet of the second supply container is connected with the supply pump.

11. The coating apparatus according to claim 10, further comprising:
- a supply liquid level sensor configured to detect a liquid level of a coating liquid in the second supply container;
- a recycled liquid level sensor configured to detect a liquid level of a coating liquid recycled by the recycling device; and
- a supply control device configured to control a communication state between the recycled liquid outlet of the recycling device and the liquid inlet of the supply device according to detection results of the supply liquid level sensor and the recycled liquid level sensor.

* * * * *